United States Patent [19]

Yamada

[11] Patent Number: 4,907,050
[45] Date of Patent: Mar. 6, 1990

[54] SOLID-STATE IMAGE PICKUP DEVICE
[75] Inventor: Tetsuo Yamada, Yokohama, Japan
[73] Assignee: Kabushiki Kaisha Toshiba, Kawasaki, Japan
[21] Appl. No.: 71,665
[22] Filed: Jul. 9, 1987
[30] Foreign Application Priority Data Jul. 11, 1986 [JP] Japan ................... 61-163463

[51] Int. Cl.⁴ .................. H01L 29/78; H01L 27/14; H01L 31/00
[52] U.S. Cl. ...................... 357/24; 357/30; 357/89
[58] Field of Search .................. 357/24, 30
[56] References Cited
U.S. PATENT DOCUMENTS

4,484,210 11/1984 Shiraki et al. .............. 357/24 LR
4,597,013 6/1986 Matsumoto ................. 357/24 LR Primary Examiner—Gene M. Munson
Attorney, Agent, or Firm—Foley & Lardner, Schwartz, Jeffery, Schwaab, Mack, Blumenthal & Evans

[57] ABSTRACT

A solid-state image pickup device includes a semiconductor substrate of a first conductivity type, and a photoelectric cell, including an impurity region of a second conductivity type formed on the semiconductor substrate, to produce a signal charge corresponding to the quantity of incident light at a first junction surface between the impurity region of the second conductivity type and the semiconductor substrate. The device further includes an impurity region of the first conductivity type formed on the semiconductor substrate to effect isolation between the impurity regions of the second conductivity type, and a charge transfer unit for transferring the signal charge produced in the photoelectric cell. This device is characterized in that the impurity concentration of the impurity region of the second conductivity type is high in the vicinity of at least a portion of a second junction surface between the impurity region of the second conductivity type and the impurity region of the first conductivity type, and is low in a range spaced from the second junction surface. With the device thus configured, under a greatly reverse-biased condition due to charge transportation, the high concentration portion of the impurity region of the second conductivity type is depleted, and under a small reverse-biased condition at the time of the charge accumulation, the high concentration portion is placed in a non-depleted condition. This permits the junction capacity at the time of the charge accumulation to be large, thus enabling realization of a solid-state image pickup device having less afterimage.

8 Claims, 6 Drawing Sheets

SOLID-STATE IMAGE PICKUP DEVICE

BACKGROUND OF THE INVENTION

The present invention relates to a solid-state image pickup device, and more particularly to the structure of a photoelectric cell in a solid-state image pickup device.

Solid-state image pickup or camera devices have been conventionally used in various fields of facsimiles or OCRs (Optical Character Readers) etc. Since solid-state image pickup devices having a large number of light sensitive pixels can be made up, particularly in recent years, use as the substitution for pickup tubes for cameras is being increased.

Figure 1A:
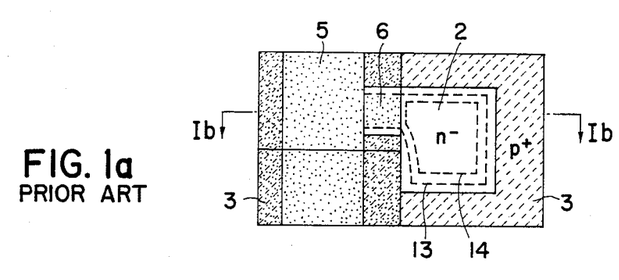
FIG. 1(a) is a plan view showing a conventional solid-state image pickup device.
Figure 1B:
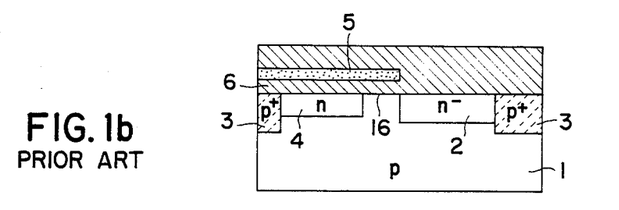
FIG. 1(b) is a cross sectional view taken along the lines Ib—Ib of FIG. 1(a)

A conventional solid-state image pickup device is shown in FIGS. 1(a) and 1(b). FIG. 1(a) is a plan view showing the solid-state image pickup device, and FIG. 1(b) is a cross sectional view taken along the lines $I_b$-$I_b$ of FIG. 1(a). On the surface of a p-type semiconductor substrate 1, an island-shaped n-type impurity region 2 is formed. By the pn junction of the p-type semiconductor substrate 1 and the n-type impurity region 2, a photoelectric cell is formed. In addition, on the surface of the p-type semiconductor substrate 1, a transport channel 16 and an n-type impurity region 4 serving as a charge transfer channel are formed. The island-shaped n-type impurity region 2 is surrounded by a p-type p+ impurity region 3 and is isolated from the adjacent impurity region 2. On the impurity region 4 and the transport channel 16 formed on the semiconductor substrate 1, a charge transfer electrode 5 is provided through an insulating layer 6.

Figure 1C:
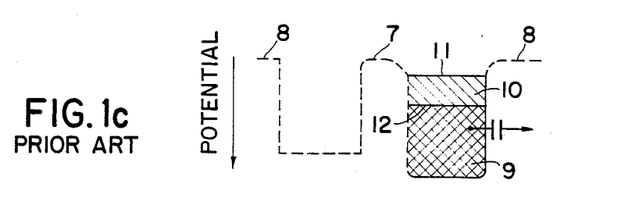
FIGS. 1(c) and 1(d) show potential distribution diagrams of the conventional solid-state image pickup device shown in FIG. 1(a)

When a light is incident to the n-type impurity region 2, signal charges are produced on the pn junction surface between the p-type semiconductor substrate 1 and the n-type impurity region 2. In cases where the potential of the charge transfer electrode 5 represents L level, the signal charges 9 and 10 thus produced are accumulated or stored into the n-type impurity region 2 as shown in FIG. 1(c). In this case, the level 8 is a potential level of the p+ impurity region 3 for isolation between cells, the level 7 is a level of the transport channel 16 when the charge transfer electrode 5 is at L level, and the level 11 is a level of the n-type impurity region 2 which has been lowered by the accumulation of the signal charges 9 and 10.

Figure 1D:
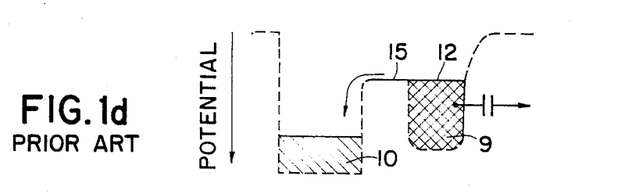

When the charge transfer electrode 5 shifts to H level, the level 7 is raised to the level 15 as shown in FIG. 1(d). As a result, the signal charge 10 whose level is smaller than the level 15 is transported to the n-type impurity region 4 via the transport channel 16 and is accumulated thereinto. Thus, the level of the n-type impurity region 2 is raised to the level 12, so that the signal charge 9 remains therein.

Figure 2:
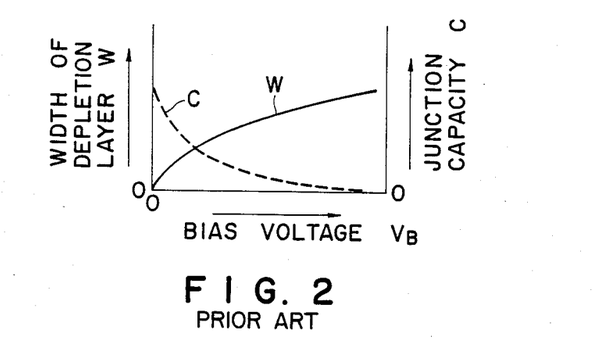
FIG. 2 is a graph for explaining the operation of the operational principle of the conventional solid-state image pickup device shown in FIG. 1(a)

Immediately after the charge transportation has been conducted, the n-type impurity region 2 is greatly reverse-biased by the potential difference between the level 12 of the n-type impurity region 2 and the level 8 of the n-type impurity region 3 for isolation between cells. Accordingly as signal charges are accumulated, the reverse bias voltage lowers. Accordingly, the width W of the depletion layer formed by the n-type impurity region 2 and the p+ impurity region 3 surrounding it becomes narrower as signal charges accumulated increase. As a result, the capacity of the junction of the n-type impurity region 2 and the p+ impurity region 3 becomes large. In general, the width W of the depletion layer is proportional to one-half power of the reverse bias voltage and depicts a characteristic curve as shown in FIG. 2. When the impurity concentration of the n-type impurity region 2 is high, charges 9 remaining in the n-type impurity region 2 after transportation are increased. As a result, there occurs to much extent the well known thermal charge emission wherein charges gradually move to the n-type impurity region 4 serving as the transfer channel, giving rise to afterimage in the solid-state image pickup device.

For this reason, the n-type impurity region 2 is formed so that the impurity concentration thereof is sufficiently lower than that of the p+ impurity region 3 serving as the layer for isolation between cells. Thus, the depletion layer is formed principally within the n-type impurity region 2. Reference numerals 13 and 14 in FIG. 1(a) represent a charge accumulated condition and the edge of the depletion layer within the n-type impurity region 2 immediately after transportation, respectively.

On the other hand, when the impurity concentration of the n-type impurity region 2 is low, the width W of the depletion layer becomes broader. Thus, the junction capacity is lowered, with the result that the charge accumulation capacity becomes small. Accordingly, it is difficult to ensure a necessary accumulation capacity to lower the impurity concentration of the n-type impurity region 2 to much extent. As a result, there was nothing to do but tolerate that afterimage occurred to some extent.

SUMMARY OF THE INVENTION

An object of the present invention is to provide a solid-state image pickup device in which the charge accumulation capacity is large and the afterimage is little.

The above object is achieved by the provision of a solid-state image pickup device comprising: a semiconductor substrate of a first conductivity type; a photoelectric cell including an impurity region of a second conductivity type formed on the semiconductor substrate of the first conductivity type to produce a signal charge corresponding to the quantity of an incident light at a first junction surface between the impurity region of the second conductivity type and the semiconductor substrate of the first conductivity type; an impurity region of the first conductivity type formed on the semiconductor substrate of the first conductivity type to effect isolation between the impurity regions of the second conductivity type; and a charge transfer unit for transferring a signal charge produced in the photoelectric device, wherein the impurity concentration of the impurity region of the second conductivity type is high in the vicinity of at least a portion of a second junction surface between the impurity region of the second conductivity type and the impurity region of the first conductivity type, and is low in a range spaced from the second junction surface.

Since the solid-state image pickup device according to the present invention is configured as stated above, under a greatly reverse-biased condition due to the charge transportation, the portion having high concentration of the impurity region of the second conductivity type is depleted, and under a little reverse-biased condition at the time of charge accumulation, the portion of high concentration is placed in a non-depleted condition, whereby the junction capacity at the time of the charge transportation becomes small and the junction capacity at the time of the charge accumulation becomes large to a great extent.

DETAILED DESCRIPTION OF THE INVENTION

A first embodiment of a solid-state image pickup device according to the present invention is shown in FIG. 3. FIG. 3(a) is a plan view showing the solid-state image pickup device of this embodiment and FIG. 3(b) is a cross sectional view taken along the line IIIb—IIIb of FIG. 3(a). On the surface of the p-type semiconductor substrate 1, an island-shaped n-type $n^-$ impurity region 17 having low concentration is formed. By the pn junction of the p-type semiconductor substrate 1 and the $n^-$ impurity region 17, a photoelectric cell is formed. In addition, on the surface of the p-type semiconductor substrate 1, a transport channel 16 and an n-type impurity region 4 serving as a charge transfer channel are formed. The island-shaped $n^-$ impurity region 17 is surrounded by a $p^+$ impurity region 3 having high concentration and is isolated from the adjacent $n^-$ impurity region 17. On the impurity region 4 and the transport channel 16 formed on the semiconductor substrate 1, a charge transfer electrode 5 is provided through an insulating layer 6.

Figure 3A:
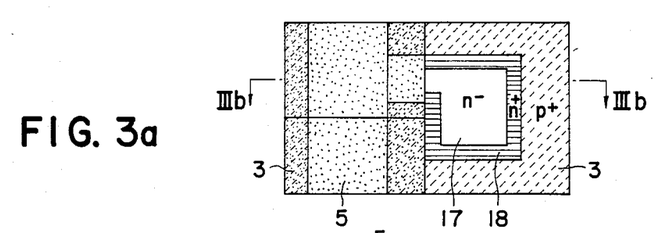
FIG. 3(a) is a plan view showing a first embodiment of a solid-state image pickup device according to the present invention.
Figure 3B:
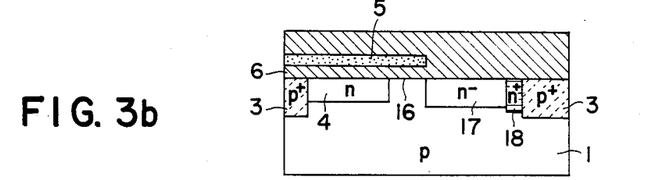
FIG. 3(b) is a cross sectional view taken along the lines IIIb—IIIb of FIG. 3(a)
Figure 3C:
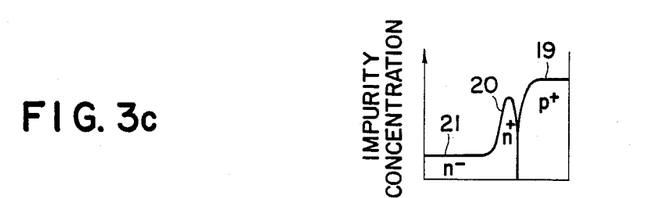
FIG. 3(c) is a graph showing the impurity concentration of the solid-state image pickup device shown in FIG. 3(a)

The solid-state image pickup device of this embodiment is characterized in that there is further provided an $n^+$ impurity region 18 having high concentration between the $n^-$ impurity region 17 and the $p^+$ impurity region 3. Namely, the $n^+$ impurity region 18 having high concentration exists in the vicinity of the junction surface between the $n^-$ impurity region 17 and the $p^+$ impurity region 3 and surrounds the $n^-$ impurity region 17 having low concentration. It is to be noted that the $n^+$ impurity region 18 may completely surround the entire peripheral edge of the $n^-$ impurity region 17. The impurity concentration distributions of the $n^-$ impurity region 17, the $n^+$ impurity region 18 and the $p^+$ impurity region 3 are shown in FIG. 3(c). As best shown in this figure, with the $p^+$ impurity region 3 having high concentration (the concentration distribution 19), the $n^+$ impurity region 18 also having high concentration (the concentration distribution 20) is joined. In a range spaced from the junction surface, the $n^-$ impurity region 17 having low concentration (the concentration distribution 21) exists.

Figure 3D:
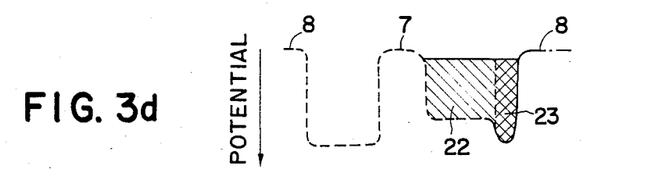
FIGS. 3(d) and 3(e) show potential distribution diagrams of the solid-state image pickup device shown in FIG. 3(a)
Figure 3E:
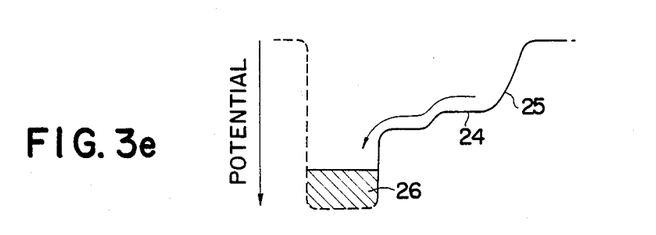

The operation of this embodiment will be explained with reference to the potential distribution diagrams shown in FIGS. 3(d) and 3(e). FIG. 3(d) is the potential diagram in a charge accumulated condition and FIG. 3(e) is the potential diagram in a charge transfer condition. When a light is incident to the $n^-$ impurity region 17 and the $n^+$ impurity region 18, signal charges are produced on the pn junction surfaces between the semiconductor substrate 1 and the $n^-$ impurity region 17 and between the semiconductor substrate 1 and the $n^+$ impurity region 18. In cases where the potential of the charge transfer electrode 5 represents L level, the signal charges 22 and 23 thus produced are accumulated into the $n^-$ impurity region 17 and the $n^+$ impurity region 18, as shown in FIG. 3(d), respectively. In this case, the level 8 is a potential level of the $p^+$ impurity region 3 for isolation between cells and the level 7 is a level of the transport channel 16 when the charge transfer electrode 5 is at L level.

When the charge transfer electrode 5 shifts to H level for transporting the accumulated charges, the level 7 varies. Thus, the charges 22 and 23 are moved or transported to the n-type impurity region 4 via the transport channel 16, so that the $n^-$ impurity region 17 and the $n^+$ impurity region are placed in a greatly reverse-biased condition. By the effect of the reverse bias, a depletion layer extends from the $p^+$ impurity region 3 to the $n^+$ impurity region 18. Thus, the voltage of the region 18 reaches a predetermined voltage and is completely depleted. When the $n^+$ impurity region 18 has been completely depleted, the depletion layer rapidly extends over the $n^-$ impurity region 17. In this instance, since the $n^-$ impurity region 17 is in low concentration condition, the expansion of the depletion layer with respect to the reverse bias voltage increases in proportion to a factor of approximately $$\sqrt{N_{D1}/N_{D2}}$$

($N_{D1}$ and $N_{D2}$ are impurity concentrations of the $n^-$ impurity region 17 and the $n^+$ impurity region 18, respectively). Accordingly, the $n^-$ impurity region 17 and the $n^+$ impurity region 18 are completely depleted by a small increase of the reverse bias voltage, so that most of remaining charges disappear. The potential distribution diagram in this condition is shown in FIG. 3(e), wherein levels 24, 25 and 26 represent potential levels of the $n^-$ impurity region 17 and the $n^+$ impurity region 18, and a signal charge transported, respectively. Since the charge emission to the n-type impurity region 4 based on the thermal energy distribution, which existed in the conventional device, disappears due to the fact that the remaining charges disappear in this way, so called afterimage reduction (delay of charge transportation) is not caused. When the quantity of accumulated charges is further increased, so that the reverse bias voltage across the $n^-$ and $n^+$ impurity regions 17 and 18 and the $p^+$ impurity regions lowers, the width of the depletion layer is abruptly narrowed, with the result that the pn junction capacity increases. Accordingly, the maximum quantity of the accumulated charges determined by the pn junction capacity increases.

Figure 4A:
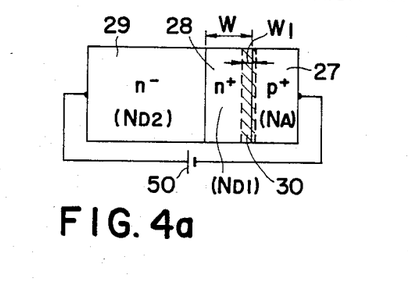
FIGS. 4(a) and 4(b) and 5 are a diagrammatical view and a graph for explaining the operational principle of the solid-state image pickup device shown in FIG. 3(a), respectively.
Figure 4B:
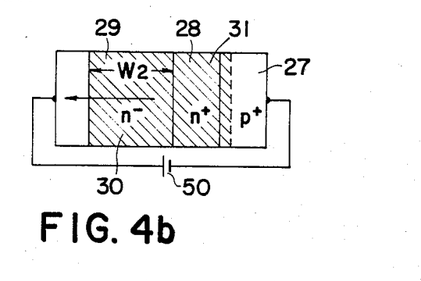

For better understanding of this principle, a simplified model is shown in FIG. 4. This model includes a $p^+$ impurity region 27 having a high concentration $N_A$, an $n^+$ impurity region 28 having a high concentration $N_{D1}$ and an $n^-$ impurity region 29 having a low concentration $N_{D2}$ wherein it is assumed that these concentrations are uniform in respective regions. This model further comprises a voltage source 50 for applying a reverse bias voltage to the $p^+$ impurity region 27 and the $n^+$ and $n^-$ impurity regions 28 and 29. In cases where the reverse bias potential difference $\phi_1$ is small, the depletion layer extends from the pn junction surface to the $p^+$ impurity region 27 and the $n^+$ impurity region 28 as indicated by a hatched region 30 and does not reach the $n^-$ impurity region 29. Assuming now that $N_A>>N_{D1}$, the width $W_1$ of the depletion layer is expressed as $$W_1 = \left[\frac{2\epsilon_{si}}{eN_{D1}} \cdot \Phi_T\right]^{\frac{1}{2}},$$

where $\epsilon_{si}$ is a dielectric constant of the silicon semiconductor and e is a quantity of a unit charge. Accordingly, the junction capacity $C_1$ is expressed as follows:

$$C_1 = \frac{\epsilon_{si}}{W_1} = \left[\frac{e\epsilon_{si}N_{D1}}{2\Phi_T}\right]^{\frac{1}{2}}.$$

Assuming that the thickness of the $n^+$ impurity region 28 is represented with W, the above relationship holds when $W_1 \geq W$, i.e., $\phi_T \geq \phi_c$ ($\phi_c$ is defined as a $\phi_T$ which satisfies $W_1=W$). When $\phi_T > \phi_c$, the $n^+$ impurity region 28 is completely depleted, so that it extends to the $n^-$ impurity region 29. Assuming that the width of the depletion layer which has extended to the $n^-$ impurity region 29 is represented with $W_2$, the sum of thicknesses $W_1+W_2$ can be expressed as follows:

$$W_1 + W_2 \approx \left(\frac{2\epsilon_{si}\Phi_T}{eN_{D2}} - W^2 \cdot \frac{N_{D1}}{N_{D2}}\right)^{\frac{1}{2}},$$

where $N_{D1}>>N_{D2}$.

The junction capacity C in this instance is expressed as follows:

$$C = \frac{\epsilon_{si}}{W_1 + W_2} \approx \sqrt{N_{D2}/N_{D1}} \cdot \left(\frac{2\Phi_T}{\epsilon_{si}eN_{D2}} - \frac{2\Phi_c}{\epsilon_{si}eN_{D1}}\right)^{-\frac{1}{2}}$$

where $\phi_c$ can be expressed as $$\Phi_c \approx \frac{1}{2} \frac{eN_{D1}}{\epsilon_{si}} \cdot W^2.$$

Figure 5:
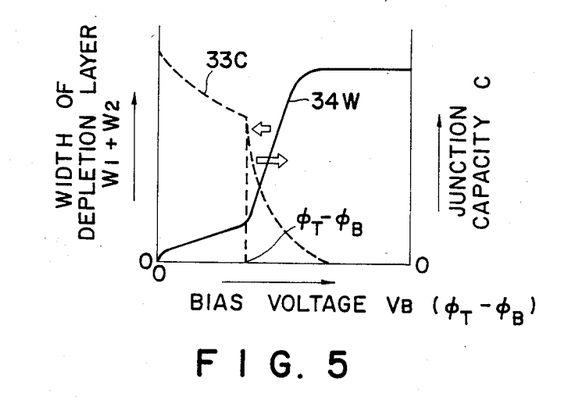

The relationship between the total width of the depletion layer $W_1+W_2$ and the junction capacity C with respect to the power supply voltage $V_B=\phi_T-\phi_B$ is shown in FIG. 5. In this figure, $\phi_B$ is a built-in potential, and a curve 34 indicated by the solid line denotes a width of the depletion layer and a curve 33 indicated by broken lines denotes a junction capacity. As seen from FIG. 5, the junction capacity is large when the relationship of $\phi_T<\phi_c$ holds in connection with the bias potential difference $\phi_T$ and abruptly decreases when the bias potential difference $\phi_T$ sufficiently becomes larger than $\phi_c$. Accordingly, under the maximum charge accumulated condition, $\phi_T<\phi_c$, a setting is made such that $\phi_T$ is sufficiently larger than $\phi_c$ under the charge transportation condition, thereby making it possible to eliminate afterimage and to increase the maximum charge accumulation capacity.

Also in this embodiment, by making a setting such that $\phi_T$ is sufficiently larger than $\phi_c$ in the condition of the charge transportation in the same manner as in the above-mentioned principle, it is possible to eliminate afterimage and to increase the charge accumulation capacity.

Figure 6A:
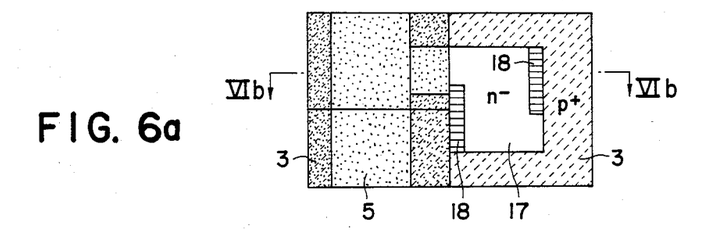
FIG. 6(a) is a plan view showing a second embodiment of a solid-state image pickup device according to the present invention.
Figure 6B:
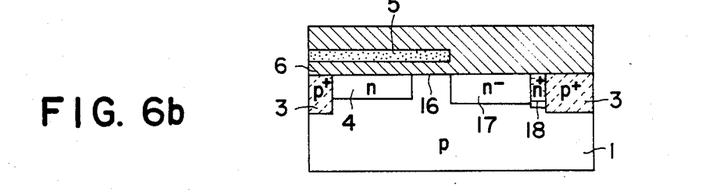
FIG. 6(b) is a cross sectional view taken along the lines VIb—VIb of FIG. 6(a)

A second embodiment of a solid-state image pickup device according to the present invention is shown in FIG. 6. FIG. 6(a) is a plan view showing the device in this embodiment and FIG. 6(b) is a cross sectional view taken along the line VIb—VIb of FIG. 6(a). In this embodiment, $n^+$ impurity regions 18 are provided in a portion of the junction surface between the $n^-$ impurity region 17 and the $p^+$ impurity region 3.

At the time of transporting accumulated charge, when the $n^-$ and $n^+$ impurity regions 17 and 18 are greatly reverse-biased, the depletion layer extends from the $p^+$ impurity region 3 to the $n^+$ impurity region 18 provided in a portion of the junction surface between the $n^-$ impurity region 17 and the $p^+$ impurity region 3 by the reverse bias thus produced. When the $n^+$ impurity region 18 has been completely depleted, the depletion layer abruptly extends to the $n^-$ impurity region 17 in the same manner as in the first embodiment. Thus, when the $n^+$ and $n^-$ impurity regions 18 and 17 have been completely depleted, most of the remaining charges disappear, thus making it possible to prevent afterimage from occurring.

When the reverse-bias voltage across the $n^-$ and $n^+$ impurity regions 17 and 18 and the $p^+$ impurity region 3 lowers, the depletion layer abruptly becomes narrow, resulting in an increase of the pn junction capacity.

As just described above, this embodiment can also provide the same advantages as those in the first embodiment.

Figure 7A:
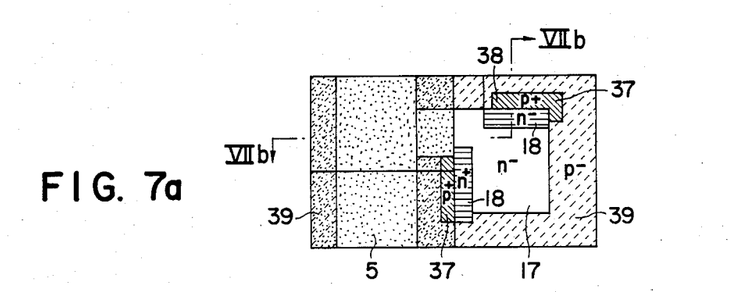
FIG. 7(a) is a plan view showing a third embodiment of a solid-state image pickup device according to the present invention.
Figure 7B:
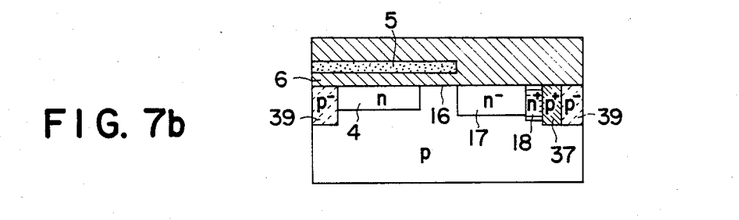
FIG. 7(b) is a cross sectional view taken along the lines VIIb—VIIb of FIG. 7(a)

A third embodiment of a solid-state image pickup device according to the present invention is shown in FIG. 7. FIG. 7(a) is a plan view showing the this embodiment and FIG. 7(b) is a cross sectional view taken along the lines VIIb—VIIb of FIG. 7(a). In this embodiment, isolation between cells is conducted by using a p$^-$ impurity region 39 having low concentration instead of the p$^+$ impurity region 3 having high concentration. The n$^+$ impurity regions 18 are provided in a portion of the junction surface between the n$^-$ impurity region 17 and p$^-$ impurity region 39 in the same manner as in the second embodiment. Only at portions adjacent to the n$^+$ impurity region 18, p$^+$ impurity regions 37 are provided. Accordingly, each p$^+$n$^+$ junction area between the p$^+$ impurity region 37 and the n$^+$ impurity region 18 exists in the above-mentioned portion.

As just described above, this embodiment can also provide the same advantages as those in the first and second embodiment.

Figure 8A:
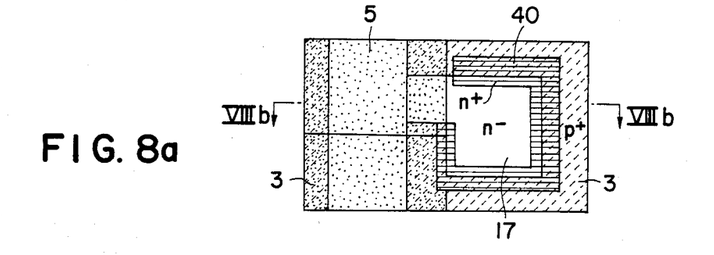
FIG. 8(a) is a plan view showing a fourth embodiment of a solid-state image pickup device according to the present invention.
Figure 8B:
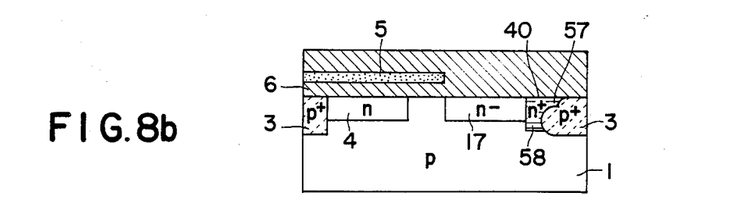
FIG. 8(b) is a cross sectional view taken along the lines VIIIb—VIIIb of FIG. 8(a)

A fourth embodiment of a solid-state image pickup device according to the present invention is shown in FIG. 8. FIG. 8(a) is a plan view showing the device in this embodiment and FIG. 8(b) is a cross sectional view taken along the lines VIIIb—VIIIb. This embodiment is characterized in that an n$^+$ impurity region 40 having high concentration is formed so as to overlap with the p$^+$ impurity region 3 having high concentration at the upper and lower portion thereof. In this case, a portion 57 overlapping with the p$^+$ impurity region 3 of the n$^+$ impurity region 40 serves as an n$^+$ impurity region substantially thinner than a portion 58 which does not overlap with the p$^+$ impurity region 3 and is depleted at a low voltage. Accordingly, even if the portion 58 is extremely small, the effect can be sufficiently accomplished.

Figure 8C:
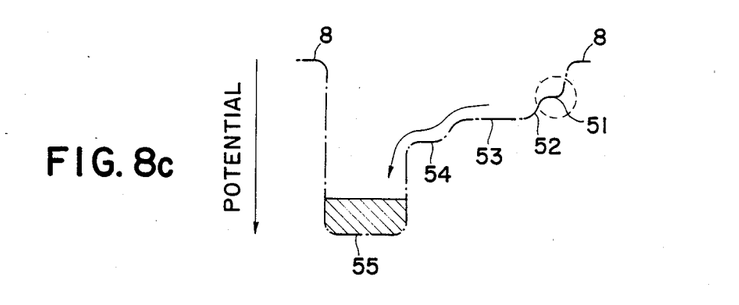
FIG. 8(c) shows a potential distribution diagram of the solid-state image pickup device shown in FIG. 8(a)

FIG. 8(c) shows a potential distribution diagram at the time of the charge transportation in this embodiment wherein the potential distribution when charges are transported from the impurity region 57 to the impurity region 58 is indicated by levels 51 and 52. In this example, the accumulation capacity based on the portion designated at 51 is added without raising a potential required for depletion in addition to the accumulation capacity designated at 52, thus making it possible to conspicuously exhibit the effect of this embodiment. It is needless to say that if the n$^+$ impurity region 40 and the p$^+$ impurity region 3 overlap in a manner opposite to the above, the effect identical to the above is obtained.

Because the junction area is large in the device according to this embodiment, the accumulation capacity can be increased. In addition, this embodiment provides the advantage that strict relative positional accuracy with respect to the p$^+$ impurity region 3 is not required in the formation of the n$^+$ impurity region 40. This is because the n$^+$ impurity region 40 has a distribution similar to the distribution shown in FIGS. 8(a) and 8(b) even if its concentration distribution deviates toward a concentration range on the side of the p$^+$ impurity region 3 or toward a concentration range on the side of the n$^-$ impurity region 17.

Figure 9A:
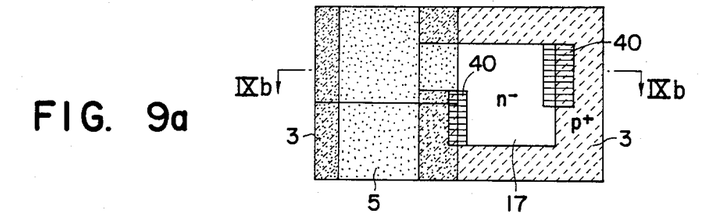
FIG. 9(a) is a plan view showing a fifth embodiment of a solid-state image pickup device according to the present invention.
Figure 9B:
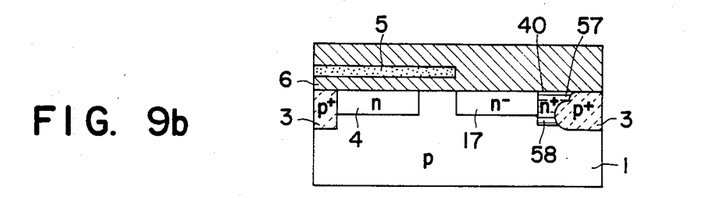
FIG. 9(b) is a cross sectional view taken along the lines IXb—IXb of FIG. 9(a)

A fifth embodiment of a solid-state image pickup device according to the present invention is shown in FIG. 9. FIG. 9(a) is a plan view showing the device in this embodiment and FIG. 9(b) is a cross sectional view taken along the lines IXb—IXb of FIG. 9(a). In this embodiment, n$^+$ impurity regions 40 are provided in a portion of the junction surface between the n$^-$ impurity region 17 and the p$^+$ impurity regions 3. This embodiment can provide the same advantages as those in the fourth embodiment.

Figure 10A:
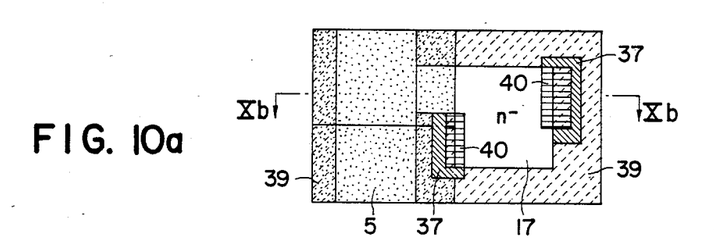
FIG. 10(a) is a plan view showing a sixth embodiment of a solid-state image pickup device according to the present invention.
Figure 10B:
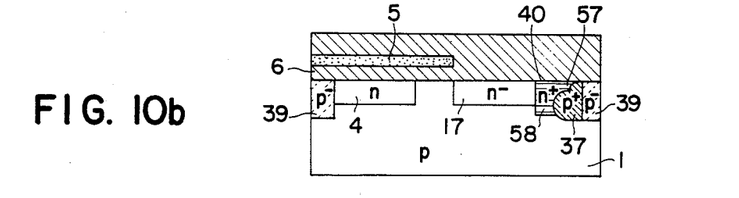
FIG. 10(b) is a cross sectional view taken along the lines Xb—Xb of FIG. 10(a).

A sixth embodiment of a solid-state image pickup device according to the present invention is shown in FIG. 10. FIG. 10(a) is a plan view showing the device in this embodiment and FIG. 10(b) is a cross sectional view taken along the lines Xb—Xb of FIG. 10(a). In this embodiment, isolation between cells or components is implemented by using a p$^-$ impurity region 39 having low concentration in place of the p$^+$ impurity region 3 having high concentration. The n$^+$ impurity regions 40 are provided in a portion of the junction surface between the n$^-$ impurity region 17 and the p$^-$ impurity region 39 in the same manner as in the second embodiment. Only at portions adjacent to the n$^+$ impurity regions 40, p$^+$ impurity regions 37 are provided. Accordingly, each p$^+$n$^+$ junction area between the p$^+$ impurity region 37 and the n$^+$ impurity region 40 exists in the above-mentioned portion. This embodiment can also provide the same advantages as those in the fourth and fifth embodiments.

While it has been described in the above-mentioned embodiments that the impurity concentration abruptly changes at the boundary between the n$^-$ impurity region and the n$^+$ impurity region, there may be employed an implementation such that the impurity concentration is high in the vicinity of the junction surface and is gradually reduced to a low concentration.

What is claimed is:

1. A solid-state image pickup device comprising:
   a semiconductor substrate of a first conductivity type;
   a photoelectric cell, including an impurity region of a second conductivity type formed on said semiconductor substrate of said first conductivity type, to produce a signal charge corresponding to a quantity of an incident light at a first junction surface between said impurity region of said second conductivity type and said semiconductor substrate of said first conductivity type;
   an impurity region of said first conductivity type, formed on said semiconductor substrate of said first conductivity type, to effect isolation between impurity regions of said second conductivity type; and
   a charge transfer unit for transferring said signal charge produced in said photoelectric cell;
   wherein the impurity concentration of said impurity region of said second conductivity type is high in the vicinity of at least a portion of a second junction surface between said impurity region of said second conductivity type and said impurity region of said first conductivity type and is low in a range spaced from said second junction surface.

2. A solid-state image pickup device as set forth in claim 1, wherein said impurity region of said second conductivity type includes a first region having a high impurity concentration provided in the vicinity of at least a portion of said second junction surface, and a second region having an impurity concentration lower than that of said first region.

3. A solid-state image pickup device as set forth in claim 2, wherein said impurity region of said first conductivity type includes a third region having a high impurity concentration provided in the vicinity of at least a portion of said second junction surface where said first impurity region of said second conductivity region is provided, and a fourth region having an impurity concentration lower than that of said third region.

4. A solid-state image pickup device as set forth in claim 3, wherein said third region and said first region overlap with each other in the vicinity of said second junction surface.

5. A solid-state image pickup device as set forth in claim 2, wherein said impurity region of said first conductivity type and said first region overlap with each other in the vicinity of said second junction surface.

6. A solid-state image pickup device as set forth in claim 1, wherein the impurity concentration of said impurity region of said first conductivity type is high in the vicinity of at least a portion of said second junction surface where the impurity concentration of said impurity region of said second conductivity type is high.

7. A solid-state image pickup device as set forth in claim 6, wherein said impurity region of said first conductivity type and said impurity region of said second conductivity type overlap with each other in the vicinity of said second junction surface.

8. A solid-state image pickup device as set forth in claim 1, wherein said impurity region of said first conductivity type and said impurity region of said second conductivity type overlap with each other in the vicinity of said second junction surface.

* * * * *